United States Patent
Cheng et al.

(10) Patent No.: US 9,892,954 B2
(45) Date of Patent: Feb. 13, 2018

(54) WAFER PROCESSING SYSTEM USING MULTI-ZONE CHUCK

(71) Applicant: TAIWAN SEMICONDUCTOR MANUFACTURING COMPANY, LTD., Hsinchu (TW)

(72) Inventors: Nai-Han Cheng, Hsinchu (TW); Chi-Ming Yang, Hsinchu (TW); You-Hua Chou, Taipei (TW); Kuo-Sheng Chuang, Hsinchu (TW); Chin-Hsiang Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 388 days.

(21) Appl. No.: 14/220,708

(22) Filed: Mar. 20, 2014

(65) Prior Publication Data
US 2014/0202383 A1    Jul. 24, 2014

Related U.S. Application Data

(62) Division of application No. 13/338,885, filed on Dec. 28, 2011, now Pat. No. 8,709,528.

(51) Int. Cl.
| | |
|---|---|
| H01L 21/67 | (2006.01) |
| H01L 21/683 | (2006.01) |
| B05C 11/00 | (2006.01) |
| C23C 16/458 | (2006.01) |
| C23C 14/50 | (2006.01) |
| H01L 21/687 | (2006.01) |

(Continued)

(52) U.S. Cl.
CPC ........ *H01L 21/68785* (2013.01); *C23C 14/50* (2013.01); *C23C 14/54* (2013.01); *C23C 16/4582* (2013.01); *C23C 16/52* (2013.01); *H01L 21/67288* (2013.01); *H01L 21/6831* (2013.01); *H01L 21/67098* (2013.01); *Y10T 29/49998* (2015.01)

(58) Field of Classification Search
None
See application file for complete search history.

(56) References Cited

U.S. PATENT DOCUMENTS

5,872,694 A * 2/1999 Hoinkis .............. H01L 21/6831
361/234
2004/0159957 A1   8/2004 Lee
(Continued)

*Primary Examiner* — Binu Thomas
(74) *Attorney, Agent, or Firm* — Hauptman Ham, LLP (57) ABSTRACT

A wafer processing system includes at least one metrology chamber, a process chamber, and a controller. The at least one metrology chamber is configured to measure a thickness of a first layer on a back side of a wafer. The process chamber is configured to perform a treatment on a front side of the wafer. The front side is opposite the back side. The process chamber includes therein a multi-zone chuck. The multi-zone chuck is configured to support the back side of the wafer. The multi-zone chuck has a plurality of zones with controllable clamping forces for securing the wafer to the multi-zone chuck. The controller is coupled to the metrology chamber and the multi-zone chuck. The controller is configured to control the clamping forces in the corresponding zones in accordance with measured values of the thickness of the first layer in the corresponding zones.

20 Claims, 7 Drawing Sheets

(51) Int. Cl.
    *C23C 14/54*     (2006.01)
    *C23C 16/52*     (2006.01)

(56) References Cited

U.S. PATENT DOCUMENTS

| | | | |
|---|---|---|---|
| 2008/0171131 A1* | 7/2008 | Moro | H01L 21/6875 118/712 |
| 2009/0026561 A1* | 1/2009 | Reichenbach | G01L 9/0073 257/416 |
| 2010/0248398 A1* | 9/2010 | Wang | H01L 21/6831 118/663 |
| 2010/0277850 A1* | 11/2010 | Chang | H01L 21/6831 361/234 |
| 2013/0171336 A1* | 7/2013 | Cheng | H01L 21/68785 29/559 |

* cited by examiner

WAFER PROCESSING SYSTEM USING MULTI-ZONE CHUCK

PRIORITY CLAIM

The present application is a divisional of U.S. application Ser. No. 13/338,885, filed Dec. 28, 2011, which is incorporated herein by reference in its entirety.

TECHNICAL FIELD

The present disclosure relates to wafer processing systems using multi-zone chucks.

BACKGROUND

A recent tendency in the field of semiconductor manufacturing is to reduce production costs by using larger wafers. The migration to a larger wafer size, while rewarding in an increased number of chips per wafer, also poses numerous technical challenges, such as maintenance of a uniform processing environment across a large wafer.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

DETAILED DESCRIPTION

It is to be understood that the following disclosure provides many different embodiments or examples, for implementing different features of various embodiments. Specific examples of components and arrangements are described below to simplify the present disclosure. An inventive concept may, however, be embodied in many different forms and should not be construed as being limited to the embodiments set forth herein; rather, these embodiments are provided so that this description will be thorough and complete, and will fully convey an inventive concept to those of ordinary skill in the art. It will be apparent, however, that one or more embodiments may be practiced without these specific details.

In the drawings, the thickness and width of layers and regions are exaggerated for clarity. Like reference numerals in the drawings denote like elements. The elements and regions illustrated in the figures are schematic in nature, and thus relative sizes or intervals illustrated in the figures are not intended to limit the scope of an inventive concept.

Figure 1:
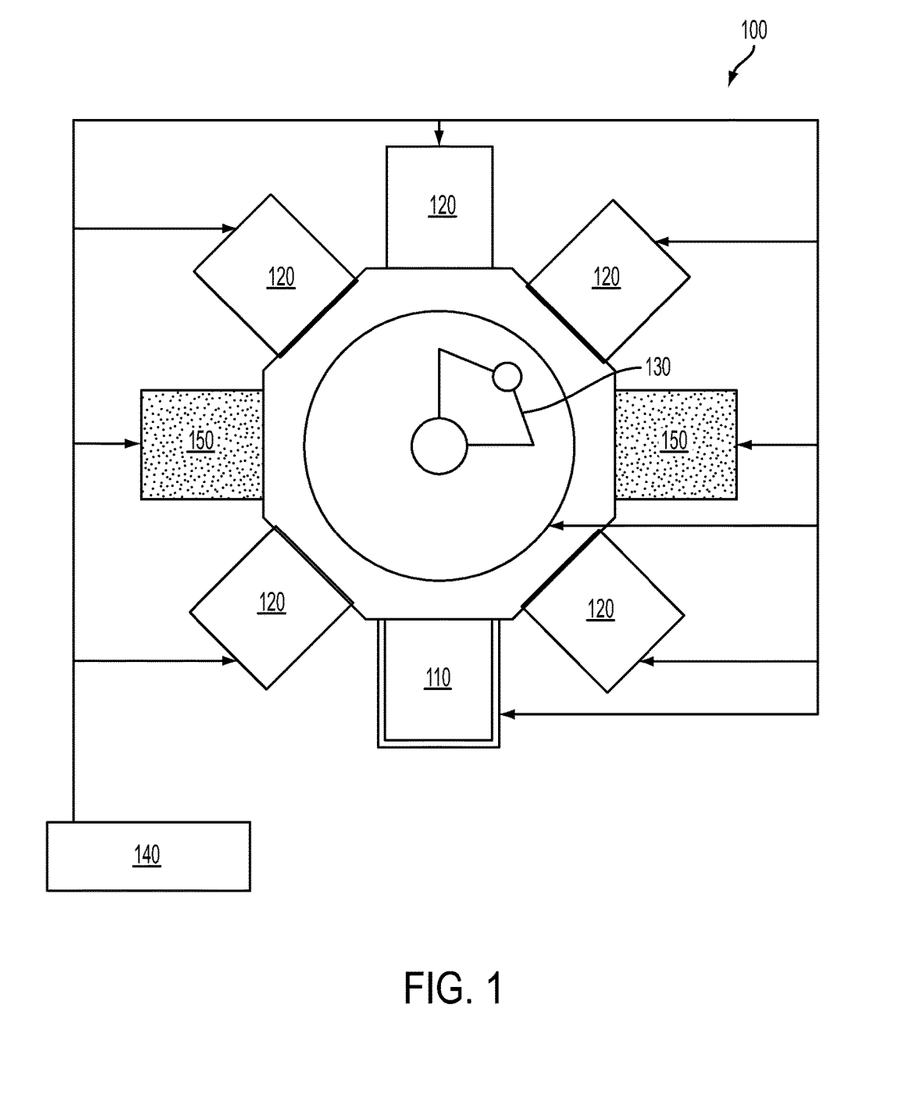
FIG. 1 is a schematic view of a wafer processing system in accordance with some embodiments.

FIG. 1 is a schematic view of a wafer processing system 100 in accordance with some embodiments. The wafer processing system 100 in FIG. 1 includes a load lock chamber 110, a plurality of process chambers 120, a robot 130, a controller 140, and one or more metrology chambers 150. The load lock chamber 110 transfers wafers into and out of the wafer processing system 100, e.g., under a vacuum environment. The robot 130 transfers the wafer among the load lock chamber 110, the process chambers 120, and the metrology chambers 150. The process chambers 120 are equipped to perform numerous processes or treatments, such as Chemical Vapor Deposition (CVD), Atomic Layer Deposition (ALD), Physical Vapor Deposition (PVD), annealing, etching, degassing, pre-cleaning, cleaning, post-cleaning, etc. The metrology chambers 150 are configured to measure various properties of wafers before, during or after processing. In some embodiments, one or more metrology chambers 150 is/are integrated in one or more of the process chambers 120. The controller 140 is configured to control wafer measurement, transfer and processing. In one or more embodiments, the controller 140 comprises a hardware platform, such as a processor or controller chip coupled with a memory, which is programmable by software and/or firmware to perform the functions described herein. In some embodiments, the controller 140 comprises a dedicated hardware circuit, e.g., in the form of an application-specific integrated circuit (ASIC) hardwired to perform one or more of the processes described herein. While five process chambers 120 and two metrology chambers 150 are shown, other numbers of process chambers 120 and/or metrology chambers 150 are within the scope of this disclosure. Likewise, in some embodiments, more than one robot 130 and/or load lock chamber 110 are included in the processing system 100.

One or more of the process chambers 120 includes therein a chuck for supporting a wafer while a treatment is being performed on the wafer in the process chamber 120. In some embodiments, the chuck is an electrostatic chuck that uses the attraction of opposite charges on the chuck and on a wafer supported by the chuck to hold or secure the wafer on the chuck. In some embodiments, the chuck is a vacuum chuck that generates vacuum pressures through a number of vacuum ports in the chuck to hold the wafer on the chuck.

Figure 2:
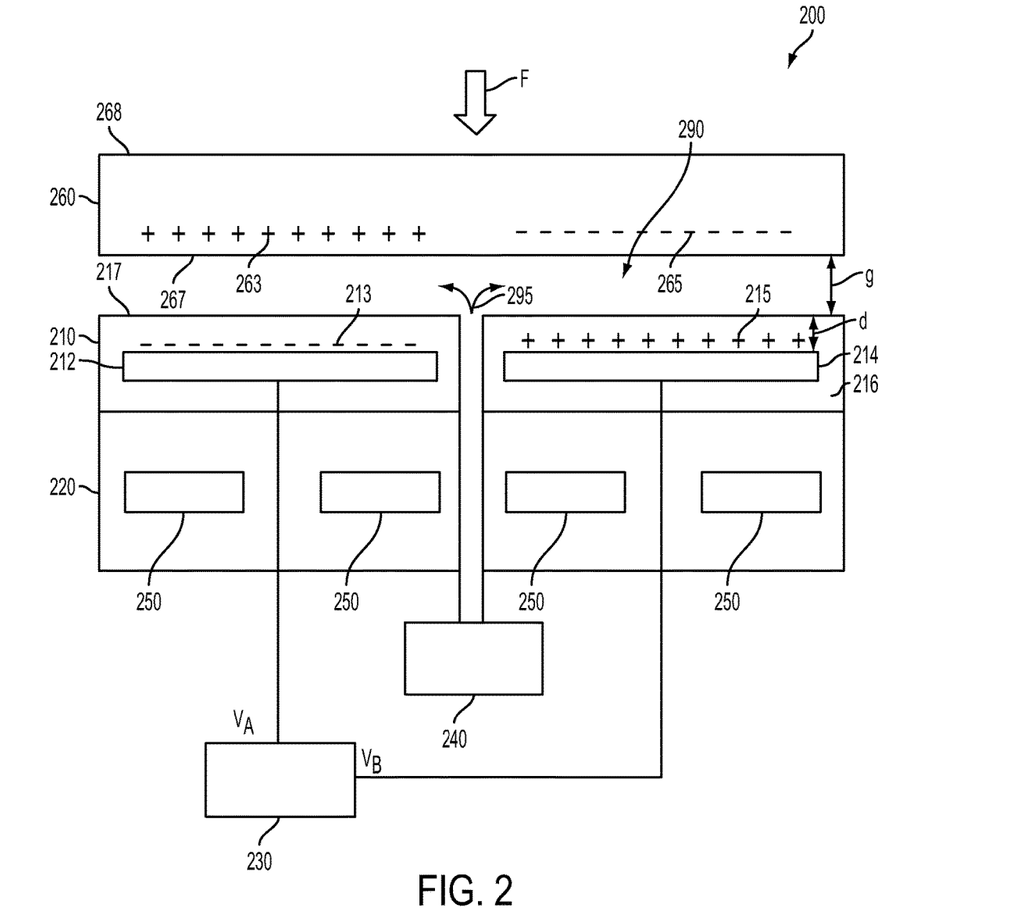
FIG. 2 is a schematic cross-section view of an electrostatic chuck in accordance with some embodiments.

FIG. 2 is a schematic cross-section view of an electrostatic chuck 200 in accordance with some embodiments for securing thereon a wafer 260. The wafer 260 has a front side 268 and an opposite, back side 267 by which the wafer 260 is supported on the electrostatic chuck 200. The electrostatic chuck 200 includes a chuck plate 210, a base 220, a voltage controller 230, a heat transfer gas source 240, and one or more heaters 250. In some embodiments, lifting pins are included to lift the wafer 260 off the chuck plate 210, and to lower the wafer 260 onto the chuck plate 210.

The chuck plate 210 includes electrodes 212, 214 embedded in a dielectric body 216. The dielectric body 216 defines a supporting surface 217 on which the wafer 260 is to be supported. The dielectric body 216 defines an insulator for the electrodes 212, 214 embedded therein.

The electrodes 212, 214 are coupled to the voltage controller 230 in a bipolar arrangement. In some embodiments, one of the electrodes 212, 214 is omitted to form a monopolar arrangement. In a monopolar arrangement, a voltage is applied from the voltage controller 230 to the electrode, e.g., 212, and causes electrostatic charges, e.g., negative charges, 213 to accumulate near the electrode 212. Electrostatic charges of the opposite polarity, e.g., positive charges, 263 accumulate in the wafer 260 on or near the back side 267 by which the wafer 260 is supported on the supporting surface 217 of the chuck plate 210. A clamping force F (also referred to as gripping force or pressure) is cause by the electrostatic attraction between the accumulated charges having opposite polarities, to hold or secure the wafer 260 on the chuck plate 210.

In a bipolar arrangement, different voltages VA, VB are applied to a pair of electrodes, e.g., the electrodes 212, 214. For example, the voltage VA applied to the electrode 212 causes negative charges 213 to accumulate near the electrode 212, whereas the voltage VB applied to the electrode 214 causes positive charges 215 to accumulate near the electrode 214. An electrode-wafer voltage V is half of the voltage between the electrodes 212, 214. Where VA is a negative voltage and VB is a positive voltage, V=(−VA+VB)/2. Electrostatic charges of opposite polarities, e.g., positive charges 263 and negative charges 265, accumulate in the wafer 260 on or near the back side 267. A clamping force F is caused by the electrostatic attraction between the accumulated charges having opposite polarities, to hold or secure the wafer 260 on the chuck plate 210.

The clamping force F depends on a variety of factors, including the size g of the gap 290, the thickness d of the dielectric body 216 between the electrodes 212, 214 and the supporting surface 217, the electrode-wafer voltage V applied to the electrodes 212, 214, the electric constant $\kappa_r$ of the dielectric body 216, etc. Namely, the clamping force F is proportional to $[\in_o/2][V\kappa_r/\{d+\kappa_r g\}]^2$, where $\in_o=8.85\times 10^{-12}$. The size g of the gap 290 affects the clamping force F. For example, when the dielectric body 216 includes alumina with an electric constant $\kappa_r$ of about 10, a gap size g of about 1/10 of the dielectric thickness d will decrease the clamping force F about 4 times.

The wafer 260 is heated by heat generated by the heaters 250 (e.g., resistive heating elements) and transferred via the dielectric body 216 and across gap 290 between the back side 267 of the wafer 260 and the supporting surface 217 of the chuck plate 210. In one or more embodiments, a heat transfer gas 295, e.g., helium, is supplied from the heat transfer gas source 240 to the gap 290 to improve heat transfer between the electrostatic chuck 200 and the wafer 260.

A gap, such as 290, exists due to one or more properties on the back side of the wafer supported on a chuck, such as warpage of the wafer, the presence of contaminants, or a varying thickness of a layer on the back side of the wafer, etc. Such properties reflect a non-uniformity on the back side of the wafer. The non-uniformity on the back side of the wafer results in different gap sizes in different areas of the wafer with respect to the chuck which, in turn, result in non-uniformity in heat transfer from one or more heater in the chuck to the wafer supported thereon. Such a non-uniform heat transfer exists whether a vacuum chuck or an electrostatic chuck is used. The non-uniform heat transfer further affects one or more other property of the wafer, e.g., uniformity of a thickness of a layer deposited on the front side of the wafer while the wafer is being secured by its back side on the chuck.

In some embodiments, by controlling the clamping forces in multiple zones of the chuck to compensate for a non-uniformity on the back side of the wafer, the wafer is brought into a uniform thermal conductivity with the chuck. Thus, a uniform heat transfer between the chuck and the wafer is achievable. For this purpose, the chuck includes multiple zones with controllable clamping forces. Such a chuck is referred to herein as a multi-zone chuck which is an electrostatic chuck in some embodiments or a vacuum chuck in further embodiments.

Figure 3A:
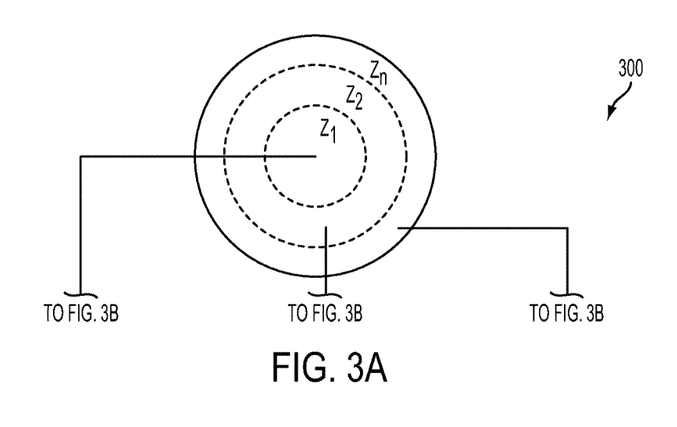
FIG. 3A is a schematic top view of a multi-zone chuck in accordance with some embodiments.
Figure 3B:
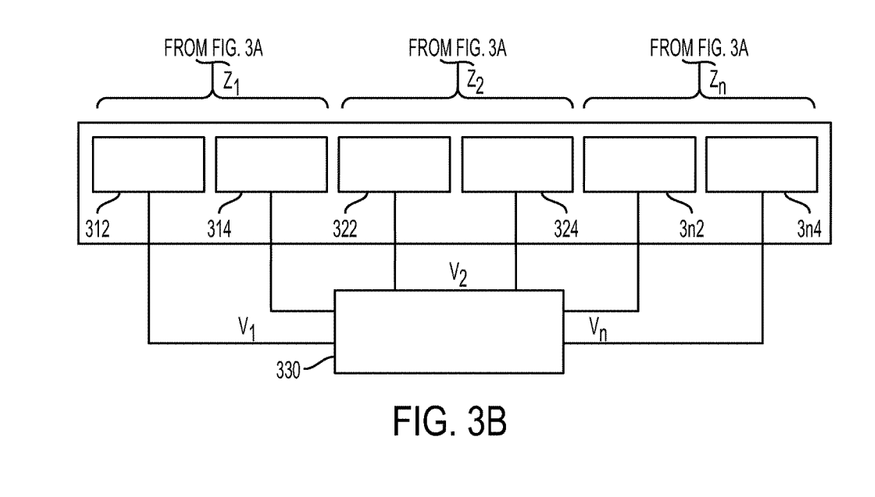
FIG. 3B is a schematic cross-section view of the multi-zone chuck of FIG. 3A.

FIG. 3A is a schematic top view of a multi-zone chuck 300 in accordance with some embodiments, and FIG. 3B is a schematic cross-section view of the multi-zone chuck 300 of FIG. 3A. The multi-zone chuck 300 includes a plurality of zones Z1, Z2, . . . Zn with corresponding clamping forces F1, F2, . . . Fn. In one or more embodiments, the clamping force in at least one of the zones is controllable independent of the clamping force in at least another one of the zones. For example, at least the clamping force F1 in the zone Z1 is controllable independent of the clamping force F2 in the zone Z2. In some embodiments, the clamping forces in each of the zones is controllable independent of the clamping forces in the other zones. For example, the clamping forces F1, F2, . . . Fn are all controllable independent of each other.

Figure 3C:
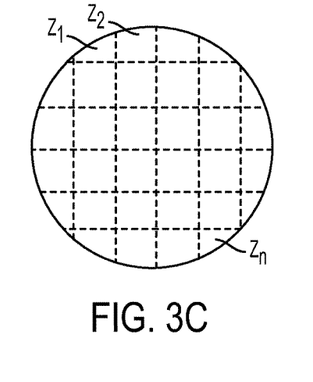
FIGS. 3C and 3D are schematic top views of multi-zone chucks in accordance with some embodiments.
Figure 3D:
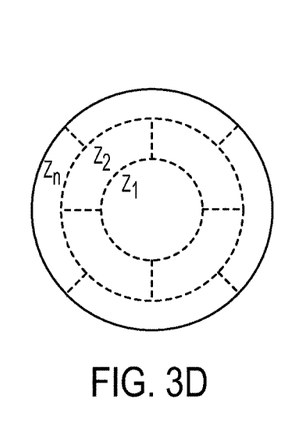

The physical arrangement and/or shape and/or number of the zones Z1, Z2, . . . Zn on the multi-zone chuck 300 is/are not limited to any particular specifics. For example, the zones Z1, Z2, . . . Zn in FIG. 3A are configured in a ring form in which each zone is one among a plurality of concentric rings. In another example, the zones Z1, Z2, . . . Zn in FIG. 3C are configured in a grid form in which each zone is one among a plurality of cells in a grid. In a further example, the zones Z1, Z2, . . . Zn in FIG. 3D are configured in a mixed form in which each zone is one among a plurality of segments of a ring among a plurality of concentric rings. The above described configurations are for illustrative purposes only and are non-limiting.

The multi-zone chuck 300 is an electrostatic chuck. The clamping forces in the zones Z1, Z2, . . . Zn are controllable by providing separate electrodes (in a monopolar arrangement) or different pairs of electrodes (in a bipolar arrangement) in different zones. Different voltages are then applied to the electrodes or the pairs of electrodes in different zones for varying the clamping forces of the zones. The bipolar arrangement is illustrated in FIG. 3B and will be described herein below. A similar description is applied to the monopolar arrangement.

In the bipolar arrangement of the multi-zone chuck 300 in FIG. 3B, each zone includes a pair of electrodes. For example, the zone Z1 includes a pair of electrodes 312, 314, the zone Z2 includes a pair of electrodes 322, 324, . . . the zone Zn includes a pair of electrodes 3n2, 3n4. The pairs of electrodes are connected to a voltage controller 330 which is configured to apply different voltages V1, V2, . . . Vn to the corresponding pairs of electrodes. Each of the voltages V1, V2, . . . Vn, e.g., V1, corresponds to the electrode-wafer voltage V discussed with respect to FIG. 2, and is half of the voltage between the corresponding electrodes, e.g., 312, 314. By controlling the voltages V1, V2, . . . Vn applied to the corresponding zones Z1, Z2, . . . Zn, the clamping forces F1, F2 . . . Fn generated in the zones Z1, Z2, . . . Zn are also controlled.

In embodiments where the multi-zone chuck is a vacuum chuck, each of the zones Z1, Z2, . . . Zn includes one or more vacuum ports to which a controllable vacuum pressure is applied from vacuum source. By controlling the vacuum pressures applied to the vacuum ports in different zones of the vacuum chuck, the clamping forces of the vacuum chuck in various zones thereof are controllable.

Figure 4:
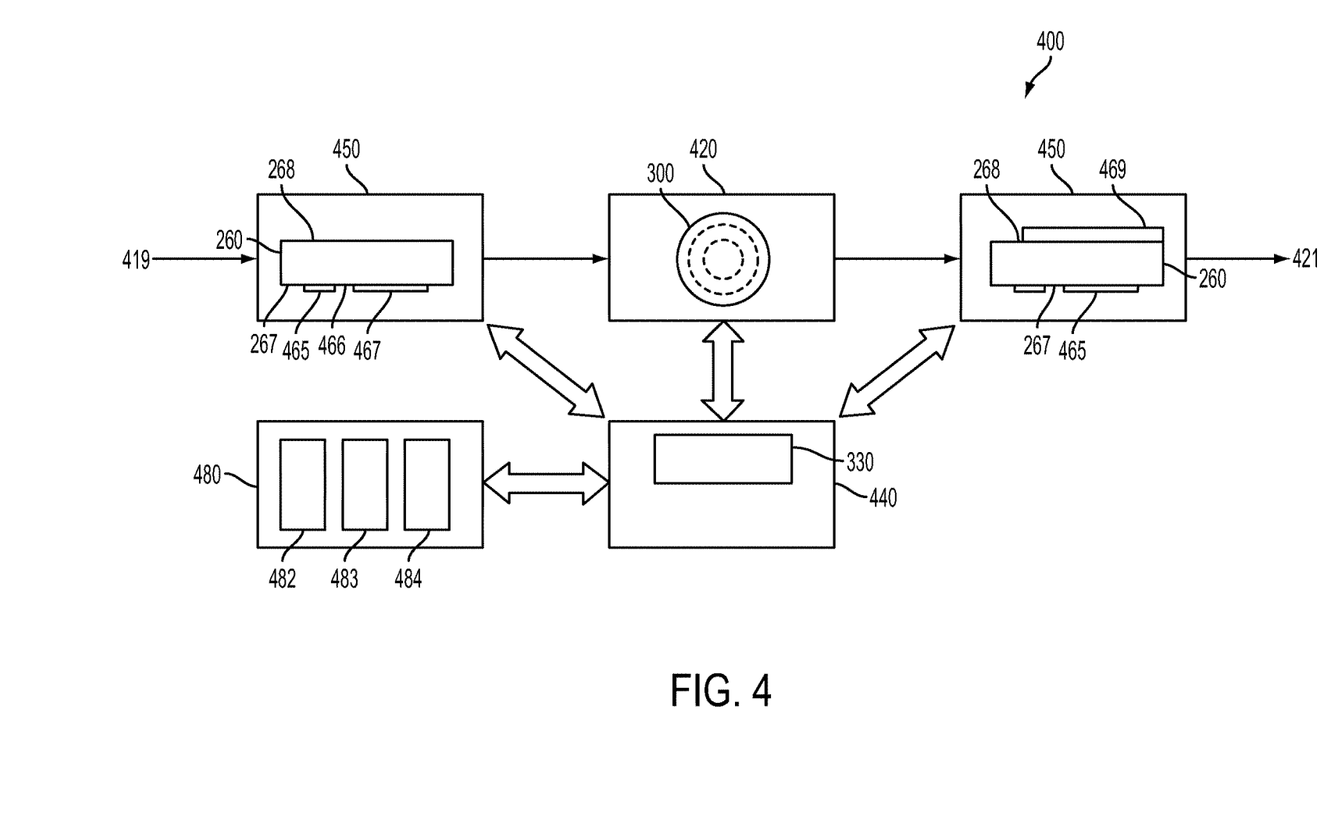
FIG. 4 is a block diagram of a wafer processing system in accordance with some embodiments.

FIG. 4 is a block diagram of a wafer processing system 400 in accordance with some embodiments. The wafer processing system 400 includes a pre-treatment metrology chamber 450, a process chamber 420, a controller 440, a storage device 480, and a post-treatment metrology chamber 456. The process chamber 420 includes a multi-zone chuck, such as the multi-zone chuck 300. The controller 440 includes a voltage controller, such as the voltage controller 330. In some embodiments, the voltage controller 330 is integrated in the multi-zone chuck 300 which is coupled to the controller 440 to be controlled by the controller 440. The controller 440 is also coupled to the metrology chambers 450, 456, the process chamber 420, and the storage device 480 for controlling or data exchange with the metrology chambers 450, 456, the process chamber 420, and the storage device 480.

In some embodiments, the controller 440 includes several units distributed among one or more of the process and metrology chambers of the wafer processing system 400. In some embodiments, one or more of the storage device 480 and the further metrology chamber 456 is omitted. In some embodiments, the metrology chamber 450 is configured to function as both a pre-treatment metrology chamber and a post-treatment metrology chamber. In some embodiments, one or more of the process chamber 420, the metrology chambers 450, 456, and the controller 440 in the wafer processing system 400 corresponds to one or more of the process chambers 120, the metrology chambers 150, and the controller 140 in the wafer processing system 100.

Figure 5:
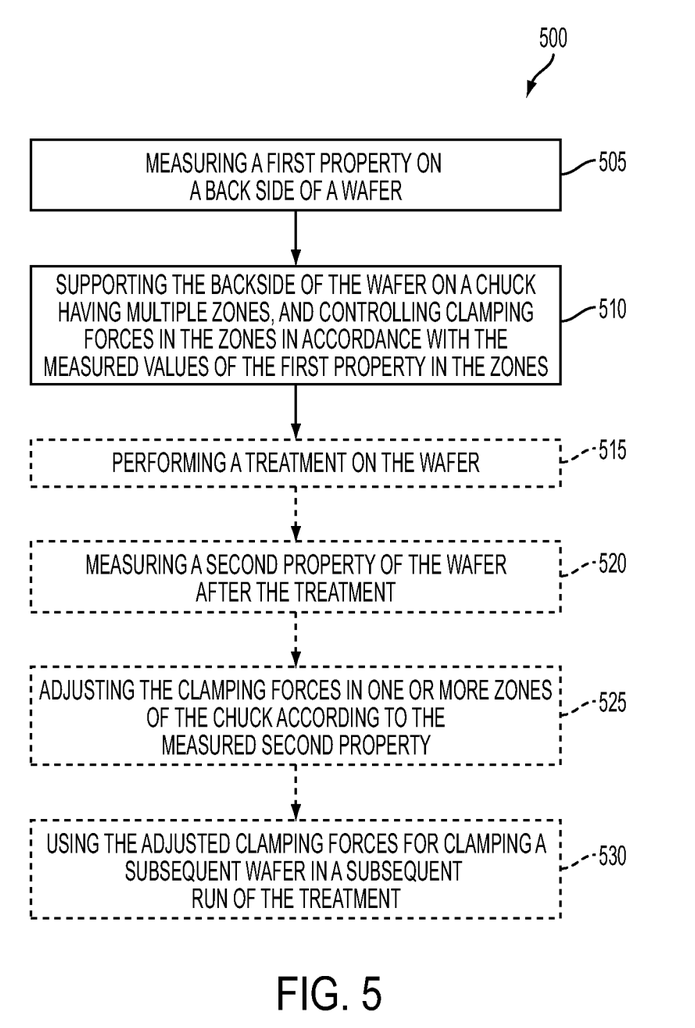
FIGS. 5-6 are flow charts of various methods in accordance with some embodiments.

FIG. 5 is a flow chart of a wafer processing method 500 in accordance with some embodiments. In one or more embodiments, the wafer processing method 500 is performed by the wafer processing system 400.

At step 505, the wafer 260 is placed inside the pre-treatment metrology chamber 450, and a first property on the back side 267 of the wafer 260 is measured by an appropriate tool equipped in the pre-treatment metrology chamber 450. In some embodiments, the first property reflects a non-uniformity on the back side 267 of the wafer 260 including, but not limited to, warpage of the wafer 260, the presence and/or nature of contaminants on the back side 267 of the wafer 260, a varying thickness of a layer on the back side 267 of the wafer 260, etc. In an example, the first property is a thickness of a first layer 465 on the back side 267 of the wafer 260. The thickness of the first layer 465 is non-uniform, i.e., is thicker in one or more regions, e.g., 467, than in one or more other regions, 466.

At step 510, the wafer 260 is transferred (e.g., by the robot 130 described with respect to FIG. 1) to the process chamber 420. In the process chamber 420, the back side 267 of the wafer 260 is supported on the multi-zone chuck 300 having a plurality of zones Z1, Z2, . . . Zn with controllable clamping forces F1, F2, . . . Fn.

The wafer 260 is then secured to the multi-zone chuck 300 by controlling the clamping forces F1, F2, . . . Fn in the corresponding zones Z1, Z2, . . . Zn in accordance with measured values P1, P2, . . . Pn of the first property in the zones Z1, Z2, . . . Zn. The controlling operation is performed by the controller 440 which obtains the measured values P1, P2, . . . Pn of the first property in the zones Z1, Z2, . . . Zn from the pre-treatment metrology chamber 450. In some embodiments, the controller 440 reads a first pre-stored data set 482, e.g., a look-up table (LUT), in the storage device 480. For each measured value of the first property in a zone, e.g., the measured value P1 in the zone Z1, the controller 440 extracts from the first pre-stored data set 482 a corresponding value for the corresponding clamping force F1. Based on the extracted value for the corresponding clamping force F1, the controller 440 controls the voltage controller 330 to apply an appropriate voltage V1 to the corresponding electrodes in the zone Z1. A similar clamping force control process is performed for the other zones of the multi-zone chuck 300. A set of voltages V1, V2 . . . Vn is thus obtained. In some embodiments, the obtained voltages V1, V2 . . . Vn are stored as voltage data 483 in the storage device 480 for subsequent use on other wafers in a wafer batch.

The first pre-stored data set 482 is determined in order to tune the controlled clamping forces F1, F2, . . . Fn toward a predetermined target. In some embodiments, where the presence and/or nature of contaminants or the non-uniformity of the thickness of the layer 465 on the back side 267 of the wafer 260 results in different gap sizes (in different zones of the multi-zone chuck 300) between the back side 267 of the wafer 260 and the multi-zone chuck 300, the first pre-stored data set 482 is determined in order to compensate for such non-uniformity, i.e., to obtain a substantially uniform gap size across the wafer. To achieve this goal, for example, voltages applied by the voltage controller 330 to the zones where the layer 465 is thick are increased compared to voltages applied to the zones where the layer 465 is thin or absent. Specifically, if the layer 465 is formed by a preceding spin coating, the zones along the edge of the wafer 260 are likely to have a lower thickness of the layer 465, and as a result, lower voltages are applied by the voltage controller 330 to the edge zones.

Another target, in accordance with in some embodiments, is a uniform heat transfer from the multi-zone chuck 300 to the wafer 260 during a treatment to be performed on the wafer 260 in the process chamber 420. Generally, a uniform gap size between the multi-zone chuck 300 and the wafer 260 results in a uniform heat transfer. However, if other factors exist, e.g., the heat transfer is conducted better through zones where the layer 465 is thinner or absent, such factors are also taken into account while developing the first pre-stored data set 482. In some embodiments, the first pre-stored data set 482 is developed by running one or more tests with one or more test wafers, and collecting the test data to develop the first pre-stored data set 482. In one or more embodiments, the first pre-stored data set 482 is developed or updated during manufacture of device wafers. In some embodiments, the first pre-stored data set 482 is presented by an equation, in addition to or in lieu of, the LUT.

In some embodiments, the controller 440 is configured to perform Advanced Process Control (APC). The control action of the controller 440 in steps 505-510 is a feed-forward control to adjust the current treatment to be performed in the process chamber 420 in order to compensate for a variability caused by an upstream treatment 419. In some embodiments, the feed-forward control is wafer-to-wafer, or batch-to-batch. In some embodiments, the controller 440 further includes a feed-back control to minimize a variability of the current treatment in a subsequent run.

Specifically, after step 515 at which the current treatment is performed in the process chamber 420 on the wafer 260, subsequent steps 520, 525, 530 constituting the feed-back control are performed. The treatment performed in the process chamber 420 includes, but is not limited to, deposition, e.g., by CVD, ALD, PVD, annealing, etching, degassing, pre-cleaning, cleaning, post-cleaning, etc.

At step 520, the wafer 260 is transferred (e.g., by the robot 130 described with respect to FIG. 1) to the post-treatment metrology chamber 456 (or back to the pre-treatment metrology chamber 450 where the metrology chamber 450 is configured to perform as both a pre-treatment and a post-treatment metrology chamber). In the post-treatment metrology chamber 456, a second property of the wafer 260 after the treatment in the process chamber 420 is measured. The second property in this post-treatment measurement is different from the first property in the pre-treatment measurement at step 505. In some embodiments, the second property is a critical dimension (CD) or thickness of a layer deposited, etched or patterned on the front side 268 of the wafer 260. After the post-treatment measurement, the wafer 260 is transferred to a downstream treatment 421.

At step 525, the controller 440 obtains the measured values Q1, Q2, . . . Qn of the second property in the zones Z1, Z2, . . . Zn from the post-treatment metrology chamber 456, and adjusts the clamping forces F1, F2, . . . Fn in the corresponding zones Z1, Z2, . . . Zn in accordance with measured values Q1, Q2, . . . Qn of the second property in the zones Z1, Z2, . . . Zn. The adjustment is performed by the controller 440 reading a second pre-stored data set 484, e.g., a LUT, in the storage device 480. For the measured value of the second property in one or more zone, e.g., the measured value Q1 in the zone Z1, the controller 440 extracts from the second pre-stored data set 484 a corresponding value for adjusting the corresponding clamping force F1. Based on the extracted value for adjusting the corresponding clamping force F1, the controller 440 controls the voltage controller 330 to update an adjusted voltage V1 to the corresponding electrodes in the zone Z1. A similar clamping force adjustment process is performed for one or more of the other zones of the multi-zone chuck 300. An adjusted set of voltages V1, V2 . . . Vn is thus obtained.

The second pre-stored data set 484 is determined in order to tune the controlled clamping forces F1, F2, . . . Fn toward a predetermined target. In some embodiments, the target is to minimize variability of the second property. For example, where the second property is a thickness of a layer 469 deposited on the front side 268 of the wafer 260, a variability (or non-uniformity) of the thickness of the deposited layer 469 was likely caused by non-uniform heat transfer from the multi-zone chuck 300 to the wafer 260 during the deposition in the process chamber 420. Specifically, an increased thickness of the deposited layer 469 in a particular zone, e.g., Z1, indicates that the heat transfer from the multi-zone chuck 300 to the wafer 260 in the zone Z1 during the deposition was excessive. Such an excessive heat transfer was likely caused by a too strong clamping force F1 in the zone Z1. The corresponding voltage V1 in the stored voltage data 483 is reduced in accordance with a corresponding value extracted by the controller 440 from the second pre-stored data set 484. Similarly, in a zone with a reduced or no thickness of the deposited layer 469, the corresponding voltage in the stored voltage data 483 is increased. In some embodiments, not every voltage in the voltage data 483 is adjusted.

In some embodiments, the second pre-stored data set 484 is developed by running one or more tests with one or more test wafers. In one or more embodiments, the second pre-stored data set 484 is developed or updated during manufacture of device wafers. In some embodiments, the second pre-stored data set 484 is presented by an equation, in addition to or in lieu of, the LUT.

The voltage data 483 after the adjustment at step 525 includes an adjusted set of voltages. At step 530, the adjusted set of voltages represents adjusted clamping forces to be generated by the multi-zone chuck 300 for securing a subsequent wafer during a subsequent run of the treatment in the process chamber 420.

Figure 6:
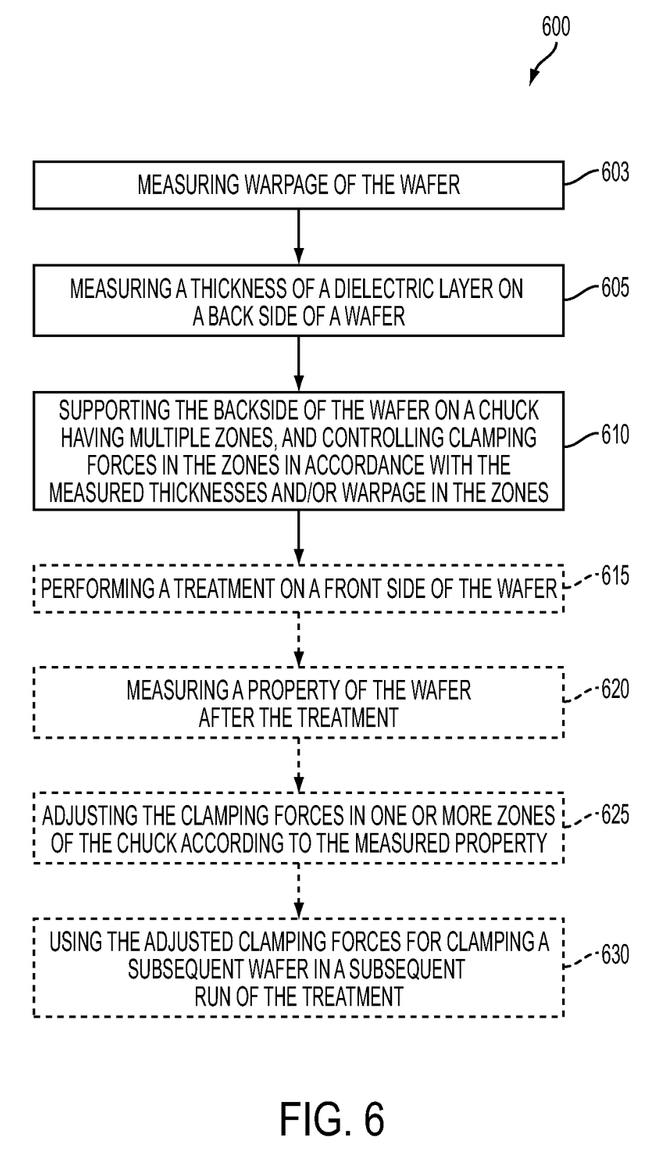

FIG. 6 is a flow chart of a wafer processing method 600 in accordance with some embodiments. In one or more embodiments, the wafer processing method 600 is performed by the wafer processing system 400.

At step 603, warpage of a wafer 260 is measured. In some embodiments, the wafer warpage is measured in the pre-treatment metrology chamber 450 or a different metrology chamber. For example, a laser is scanned on the front side 268 of the wafer 260 to measure the height of the front side 268 at a plurality of points or zones. Based on the measurement, a degree and/or a direction of the wafer warpage is/are determined.

At step 605, a thickness of the layer 465 on the back side 267 of the wafer 260 is measured, in the pre-treatment metrology chamber 450 as discussed with respect to step 505. The layer 465 is a dielectric layer in some embodiments.

At step 610, the wafer 260 is transferred to the process chamber 420. In the process chamber 420, the back side 267 of the wafer 260 is supported on the multi-zone chuck 300 having a plurality of zones Z1, Z2, . . . Zn with controllable clamping forces F1, F2, . . . Fn. The wafer 260 is then secured to the multi-zone chuck 300 by controlling the clamping forces F1, F2, . . . Fn in the corresponding zones Z1, Z2, . . . Zn in accordance with measured values T1, T2, . . . Tn of the thickness of the layer 465 in the zones Z1, Z2, . . . Zn. In addition, the clamping forces F1, F2, . . . Fn are also controlled in accordance with measured or calculated values W1, W2, . . . Wn of the wafer warpage in the zones Z1, Z2, . . . Zn. The controlling operation is performed by the controller 440 which obtains the measured or calculated values P1, P2, . . . Pn, and W1, W2, . . . Wn from the corresponding metrology chamber(s), and which reads a first pre-stored data set 482, e.g., a look-up table (LUT), in the storage device 480.

In some embodiments, the controller 440 first calculates or extracts from the first pre-stored data set 482 and for each zone of the multi-zone chuck 300, a clamping force to compensate for the wafer warpage in the zone. For example, a clamping force to be generated in a zone Z1 with a higher measured value W1 of wafer warpage (i.e., with a large gap size between the back side 267 of the wafer 260 and the multi-zone chuck 300) is controlled to be higher than in another zone Z2 with a lower measured value W2 of wafer warpage. The calculated or extracted clamping forces are presented in an initial set of voltages V1, V2, . . . Vn to be applied to the corresponding electrodes in the corresponding zones Z1, Z2, . . . Zn. The initial set of voltages V1, V2, . . . Vn would result in a uniform gap size across the wafer 260, because the corresponding clamping forces F1, F2, . . . Fn would effectively flatten the wafer 260 and compensates for the wafer warpage. However, the presence of the layer 465 with a non-uniform thickness on the back side 267 of the wafer 260 affects the clamping forces F1, F2, . . . Fn differently in zones with different values of the thickness of the layer 465. The gap size is, therefore, not uniform across the wafer.

The controller 440 further compensates for the non-uniformity in the thickness of the layer 465 by modifying the initial set of voltages V1, V2, . . . Vn based on the first pre-stored data set 482, in a manner similar to step 505. For example, the voltage V2, which would compensate for the wafer warpage in the zone Z2 but for the thickness non-uniformity of the layer 465, is further increased to compensate for a high measured value of the thickness T2 of the layer 465 in the zone Z2. Contrarily, the voltage V1, which would compensate for the wafer warpage in the zone Z1 but for the thickness non-uniformity of the layer 465, is further reduced to compensate for a low measured value of the thickness T1 of the layer 465 in the zone Z1. As a result, a modified set of voltages V1, V2, . . . Vn is obtained. In some embodiments, not every voltage in the initial set of voltage is adjusted. In some embodiments, the modified set of voltages V1, V2 . . . Vn is stored as voltage data 483 in the storage device 480 for subsequent use on other wafers in a wafer batch.

The first pre-stored data set 482 is determined in the manner described with respect to step 505, e.g., to tune the controlled clamping forces F1, F2, . . . Fn toward a predetermined target which, in some embodiments, is a uniform heat transfer from the multi-zone chuck 300 to the wafer 260 during a treatment to be performed on the wafer 260 in the process chamber 420.

In some embodiments, the controller 440 is configured to perform Advanced Process Control (APC). The control action of the controller 440 in steps 603, 605, 610 is a feed-forward control to adjust the current treatment to be performed in the process chamber 420 in order to compensate for a variability caused by an upstream treatment 419. In some embodiments, the feed-forward control is wafer-to-wafer, or batch-to-batch. In some embodiments, the controller 440 further includes a feed-back control to minimize a variability of the current treatment in a subsequent run.

Specifically, after step 615 at which the current treatment is performed in the process chamber 420 on the wafer 260, subsequent steps 620, 625, 630 constitute the feed-back control are performed. In some embodiments, steps 615-630 are similar to corresponding steps 515-530.

Steps may be added, replaced, changed order, and/or eliminated as appropriate, in accordance with the spirit and scope of embodiments of the disclosure. Embodiments that combine different features and/or different embodiments are within scope of the disclosure and will be apparent to those skilled in the art after reviewing this disclosure.

Figure 7:
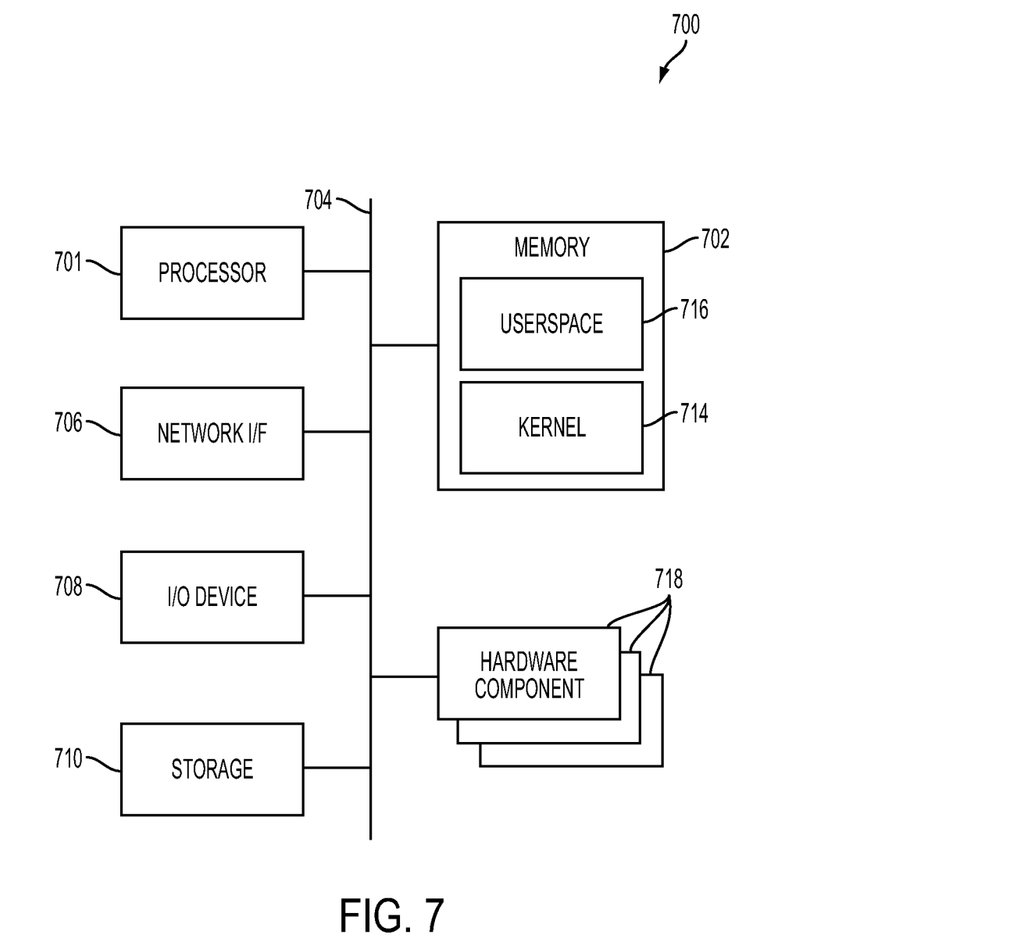
FIG. 7 is a block diagram of a computer system in accordance with some embodiments.

One or more of the controllers 140, 230, 330, 440 is realized in some embodiments as a computer system 700 of FIG. 7. The system 700 comprises a processor 701, a memory 702, a network interface (I/F) 706, a storage 310, an input/output (I/O) device 708, and one or more hardware components 718 communicatively coupled via a bus 704 or other interconnection communication mechanism.

The memory 702 comprises, in some embodiments, a random access memory (RAM) and/or other dynamic storage device and/or read only memory (ROM) and/or other static storage device, coupled to the bus 704 for storing data and instructions to be executed by the processor 701, e.g., kernel 714, userspace 716, portions of the kernel and/or the userspace, and components thereof. The memory 702 is also used, in some embodiments, for storing temporary variables or other intermediate information during execution of instructions to be executed by the processor 701.

In some embodiments, a storage device 710, such as a magnetic disk or optical disk, is coupled to the bus 704 for storing data and/or instructions, e.g., kernel 714, userspace 716, etc. The I/O device 708 comprises an input device, an output device and/or a combined input/output device for enabling user interaction with the system 700. An input device comprises, for example, a keyboard, keypad, mouse, trackball, trackpad, and/or cursor direction keys for communicating information and commands to the processor 701. An output device comprises, for example, a display, a printer, a voice synthesizer, etc. for communicating information to a user.

In some embodiments, the processes or functionality described with respect to one or more of the controllers 140, 230, 330, 440 are realized by a processor, e.g., the processor 701, which is programmed for performing such processes. One or more of the memory 702, the I/F 706, the storage 310, the I/O device 708, the hardware components 718, and the bus 704 is/are operable to receive design rules and/or other parameters for processing by the processor 701. One or more of the memory 702, the I/F 706, the storage 310, the I/O device 708, the hardware components 718, and the bus 704 is/are operable to output the configuration with the optimal property as selected by the processor 701 at steps 505, 605.

In some embodiments, one or more of the processes or functionality is/are performed by specifically configured hardware (e.g., by one or more application specific integrated circuits or ASIC(s)) which is/are included) separate from or in lieu of the processor. Some embodiments incorporate more than one of the described processes in a single ASIC.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

One or more of the following effects are achievable in accordance with one or more of the disclosed embodiments. A multi-zone chuck with controllable clamping forces include various adjustment capability, e.g., before or after a treatment. By appropriately controlling the clamping forces in the multiple zones of the multi-zone chuck, improved chuck-wafer thermal conductivity uniformity is obtainable. The control of clamping forces also compensates for a non-uniform thickness of a layer, e.g., a dielectric layer, on the back side of the wafer which reduces defects such as chucking-induced particle defects or scraps due to overstress. A film thickness uniformity tuning node is included in the form of an APC controller which varies clamping forces of the multi-zone chuck, based on feed-forward and/or feed-back control, to achieve a uniform chuck-wafer heat transfer, and hence, a thickness uniformity of a film being formed or treated on the wafer. The technique is applicable to both electrostatic and vacuum chucks.

According to some embodiments, a wafer processing system comprises at least one metrology chamber, a process chamber, and a controller. The at least one metrology chamber is configured to measure a thickness of a first layer on a back side of a wafer. The process chamber is configured to perform a treatment on a front side of the wafer. The front side is opposite the back side. The process chamber includes therein a multi-zone chuck. The multi-zone chuck is configured to support the back side of the wafer. The multi-zone chuck has a plurality of zones with controllable clamping forces for securing the wafer to the multi-zone chuck. The controller is coupled to the metrology chamber and the multi-zone chuck. The controller is configured to control the clamping forces in the corresponding zones in accordance with measured values of the thickness of the first layer in the corresponding zones.

According to some embodiments, a wafer processing system comprises at least one metrology chamber, a multi-zone electrostatic chuck, and a controller. The at least one metrology chamber is configured to measure warpage of a wafer and a thickness of a dielectric layer on a back side of the wafer. The multi-zone electrostatic chuck is configured to support the back side of the wafer. The multi-zone electrostatic chuck has a plurality of zones with controllable clamping forces for securing the wafer to the multi-zone electrostatic chuck. The controller is coupled to the metrology chamber and the multi-zone electrostatic chuck. The controller is configured to control the clamping forces in the corresponding zones in accordance with measured values of the warpage and the thickness of the dielectric layer in the corresponding zones.

According to some embodiments, a wafer processing system comprises at least one metrology chamber, a process chamber, and a controller. The at least one metrology chamber is configured to measure a first property on a back side of the wafer. The first property is different from warpage of the wafer. The process chamber is configured to perform a treatment on a front side of the wafer. The front side is opposite the back side. The process chamber includes therein a multi-zone chuck. The multi-zone chuck is configured to support the back side of the wafer. The multi-zone chuck has a plurality of zones with controllable clamping forces for securing the wafer to the multi-zone chuck. The controller is coupled to the metrology chamber and the multi-zone chuck. The controller is configured to control the clamping forces in the corresponding zones in accordance with measured values of the first property in the corresponding zones.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A wafer processing system, comprising:
    at least one metrology chamber configured to measure a thickness of a first layer on a back side of a wafer;
    a storage device;
    a process chamber configured to perform a treatment on a front side of the wafer, the front side opposite the back side, the process chamber including therein a multi-zone chuck, the multi-zone chuck configured to support the back side of the wafer, the multi-zone chuck having a plurality of zones with controllable clamping forces for securing the wafer to the multi-zone chuck; and
    a controller communicatively coupled to the at least one metrology chamber, the storage device, and the multi-zone chuck, the controller being configured to:
        obtain, from the at least one metrology chamber, a plurality of measurement values of the thickness of the first layer, each measurement value of the plurality of measurement values corresponding to a zone of the plurality of zones,
        extract a corresponding clamping force value from a data set stored in the storage device, for the each measurement value of the plurality of measurement values, and
        control the clamping forces in the zones of the plurality of zones of the multi-zone chuck in accordance with the corresponding clamping force values.

2. The wafer processing system of claim 1, further comprising:
    at least one heater included in the multi-zone chuck and configured to heat the wafer secured on the multi-zone chuck,
    wherein the controller is configured to control the clamping forces in the zones of the plurality of zones of the multi-zone chuck to achieve a uniform heat transfer from the multi-zone chuck to the wafer.

3. The wafer processing system of claim 1, wherein the controller is configured to control the clamping forces to compensate for a non-uniformity in the thickness of the first layer.

4. The wafer processing system of claim 1, wherein
    the at least one metrology chamber is configured to measure a property of the wafer after the treatment, the property being different from the thickness of the first layer, and
    the controller is configured to adjust the clamping forces in one or more zones of the plurality of zones of the multi-zone chuck in accordance with measured values of the property in the corresponding zones.

5. The wafer processing system of claim 4, wherein the controller is configured to cause the multi-zone chuck to secure a subsequent wafer with the adjusted clamping forces in the corresponding zones of the plurality of zones of the multi-zone chuck.

6. The wafer processing system of claim 4, wherein
    the property comprises a thickness of a second layer on the front side of the wafer, and
    the controller is configured to adjust the clamping forces to compensate for a non-uniformity in the thickness of the second layer.

7. The wafer processing system of claim 4, wherein
    the measured value of the property of the wafer in a first zone is greater than that in a second zone among the plurality of zones of the multi-zone chuck, and
    the controller is configured to adjust the clamping forces by at least one of (i) reducing the clamping force in the first zone or (ii) increasing the clamping force in the second zone.

8. The wafer processing system of claim 1, wherein
    the multi-zone chuck is an electrostatic chuck having a plurality of electrodes,
    each zone of the plurality of zones of the multi-zone chuck includes at least one electrode of the plurality of electrodes, and
    the controller is configured to control the clamping forces by causing different voltages to be applied to the electrodes in different zones of the plurality of zones of the multi-zone chuck in accordance with different measured values of the thickness of the first layer in the corresponding zones of the plurality of zones of the multi-zone chuck.

9. The wafer processing system of claim 1, wherein
    the multi-zone chuck is a vacuum chuck having a plurality of vacuum ports,
    each zone of the plurality of zones of the multi-zone chuck includes at least one vacuum port of the plurality of vacuum ports, and
    the controller is configured to control the clamping forces by causing different vacuum pressures to be applied to the vacuum ports in different zones of the plurality of zones of the multi-zone chuck in accordance with different measured values of the thickness of the first layer in the corresponding zones of the plurality of zones of the multi-zone chuck.

10. A wafer processing system, comprising:
    at least one metrology chamber configured to measure warpage of a wafer and a thickness of a dielectric layer on a back side of the wafer;
    a storage device;
    a multi-zone electrostatic chuck configured to support the back side of the wafer, the multi-zone electrostatic chuck having a plurality of zones with controllable clamping forces for securing the wafer to the multi-zone electrostatic chuck; and a controller communicatively coupled to the at least one metrology chamber, the storage device, and the multi-zone electrostatic chuck, the controller being configured to:

obtain, from the at least one metrology chamber, a plurality of first measurement values of the warpage of the wafer, each first measurement value of the plurality of first measurement values corresponding to a respective zone of the plurality of zones, obtain, from the at least one metrology chamber, a plurality of second measurement values of the thickness of the dielectric layer, each second measurement value of the plurality of second measurement values corresponding to a respective zone of the plurality of zones, extract from a data set stored in the storage device, a plurality of clamping force values corresponding to the plurality of zones, the plurality of clamping force values being based on at least one first measurement value of the plurality of first measurement values and at least one second measurement value of the plurality of second measurement values, and control the clamping forces in the zones of the plurality of zones of the multi-zone electrostatic chuck in accordance with the corresponding clamping force values.

11. The wafer processing system of claim 10, further comprising:

at least one heater included in the multi-zone electrostatic chuck and configured to heat the wafer secured on the multi-zone electrostatic chuck, wherein the controller is configured to control the clamping forces in the zones of the multi-zone electrostatic chuck to achieve a uniform heat transfer from the multi-zone electrostatic chuck to the wafer.

12. The wafer processing system of claim 10, wherein the multi-zone electrostatic chuck has a plurality of electrodes, each zone of the plurality of zones of the multi-zone electrostatic chuck includes at least one electrode of the plurality of electrodes, and the controller is configured to control the clamping forces by determining a set of voltages to be applied to the plurality of electrodes, wherein the voltage of the set of voltages to be applied to the electrode of the plurality of electrodes in a zone of the plurality of zones with a higher first measurement value of the plurality of first measurement values is higher than the voltage of the set of voltages to be applied to the electrode of the plurality of electrodes in a zone of the plurality of zones with a lower first measurement value of the plurality of first measurement values.

13. The wafer processing system of claim 12, wherein the controller is configured to control the clamping forces further by:

modifying the determined set of voltages by at least one of (i) increasing the voltage of the set of voltages to be applied to the electrode of the plurality of electrodes in a zone with a higher second measurement value of the plurality of second measurement values, or (ii) decreasing the voltage of the set of voltages to be applied to the electrode of the plurality of electrodes in a zone with a lower second measurement value of the plurality of second measurement values, and applying the voltages in the modified set of voltages to the corresponding electrodes in the plurality of zones of the multi-zone electrostatic chuck.

14. The wafer processing system of claim 13, further comprising:

a process chamber including the multi-zone electrostatic chuck therein, the process chamber configured to deposit a layer on the front side of the wafer while the wafer is being secured by the controlled clamping forces of the multi-zone electrostatic chuck, wherein the at least one metrology chamber is configured to measure a thickness of the deposited layer on the front side of the wafer, and the controller is configured to adjust the modified set of voltages in accordance with measured values of the thickness of the deposited layer in the corresponding zones.

15. The wafer processing system of claim 14, wherein the controller is configured to adjust the modified set of voltages by at least one of (i) increasing the voltage of the set of voltages to be applied to the electrode of the plurality of electrodes in a zone of the plurality of zones with a lower measured value of the thickness of the deposited layer, or (ii) decreasing the voltage of the set of voltages to be applied to the electrode of the plurality of electrodes in a zone of the plurality of zones with a higher measured value of the thickness of the deposited layer.

16. The wafer processing system of claim 15, wherein the controller is configured to cause the modified set of voltages to be applied to the corresponding electrodes in the plurality of zones of the multi-zone electrostatic chuck to secure a subsequent wafer on the multi-zone electrostatic chuck.

17. A wafer processing system, comprising:

at least one metrology chamber configured to measure a first property on a back side of the wafer, the first property being different from warpage of the wafer;

a storage device;

a process chamber configured to perform a treatment on a front side of the wafer, the front side opposite the back side, the process chamber including therein a multi-zone chuck, the multi-zone chuck configured to support the back side of the wafer, the multi-zone chuck having a plurality of zones with controllable clamping forces for securing the wafer to the multi-zone chuck; and a controller communicatively coupled to the at least one metrology chamber, the storage device, and the multi-zone chuck, the controller being configured to:

obtain, from the at least one metrology chamber, a plurality of measurement values of the first property, each measurement value of the plurality of measurement values corresponding to a zone of the plurality of zones, extract a corresponding clamping force value from a data set stored in the storage device, for the each measurement value of the plurality of measurement values, and control the clamping forces in the zones of the plurality of zones of the multi-zone chuck in accordance with the corresponding clamping force values.

18. The wafer processing system of claim 17, wherein the controller is configured to perform an Advanced Process Control (APC) technique using a feed-forward arrangement to control the clamping forces in the corresponding zones of the multi-zone chuck.

19. The wafer processing system of claim 17, further comprising
- at least one heater included in the multi-zone chuck and configured to heat the wafer via heat transfer from the multi-zone chuck to the wafer,
- wherein the controller is configured to perform an Advanced Process Control (APC) technique using a feed-forward arrangement to control the clamping forces in the corresponding zones of the multi-zone chuck to compensate for a non-uniformity in the heat transfer.

20. The wafer processing system of claim 17, wherein the plurality of zones in the multi-zone chuck is arranged in at least one of (i) a ring form or (ii) a grid form.

* * * * *